(12) United States Patent
Uno et al.

(10) Patent No.: US 8,084,080 B2
(45) Date of Patent: *Dec. 27, 2011

(54) PLASMA PROCESSING METHOD AND PLASMA PROCESSING APPARATUS

(75) Inventors: Yusuke Uno, Tokyo (JP); Norikatsu Nakamura, Tokyo (JP); Hiroki Sakata, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 429 days.

This patent is subject to a terminal disclaimer.

(21) Appl. No.: 11/680,743

(22) Filed: Mar. 1, 2007

(65) Prior Publication Data

US 2007/0207276 A1 Sep. 6, 2007

(30) Foreign Application Priority Data

Mar. 2, 2006 (JP) ................................. 2006-055976

(51) Int. Cl.
*B05D 5/12* (2006.01)
(52) U.S. Cl. ..................... 427/58; 427/569; 219/121.36; 118/723 E; 315/111.21
(58) Field of Classification Search ............. 219/121.36; 118/723 E
See application file for complete search history.

(56) References Cited

U.S. PATENT DOCUMENTS

| 5,225,651 | A  | * | 7/1993  | De Gelis et al. | ......... 219/121.43 |
| 5,502,355 | A  | * | 3/1996  | Mashiro | ................... 315/111.21 |
| 6,916,401 | B2 | * | 7/2005  | Long | ......................... 156/345.43 |
| 7,595,462 | B2 | * | 9/2009  | Uno et al. | ................. 219/121.36 |
| 2002/0170676 | A1 | * | 11/2002 | Mitrovic et al. | ......... 156/345.47 |
| 2004/0247790 | A1 | * | 12/2004 | Moriyama | ..................... 427/256 |
| 2007/0065597 | A1 | * | 3/2007  | Kaido et al. | .................. 427/569 |
| 2007/0210036 | A1 | * | 9/2007  | Uno et al. | ................. 219/121.36 |

FOREIGN PATENT DOCUMENTS

| JP | 3328297     | 9/2002 |
| JP | 2002-320845 | 11/2002 |
| JP | 2005-19150  | 7/2005 |

* cited by examiner

*Primary Examiner* — Shamim Ahmed
(74) *Attorney, Agent, or Firm* — Ladas & Parry LLP

(57) ABSTRACT

A plasma processing is performed by providing a first and a second electrodes to be relatively parallelly movable, disposing an object to be processed on the second electrode so as to face the first electrode and providing a blocking member to both end portions of the second electrode, so that a plasma processing space is blocked by the blocking member when the first and second electrodes are moved relatively with each other. A voltage is applied to both the first and the second electrodes and a process gas is introduced into the plasma processing space formed between the first and second electrodes, and the plasma is irradiated to the object. The blocking member is provided so as to extend from the second electrode to the first electrode, and an upper surface of the blocking member is raised higher than a surface level of the object to be processed.

4 Claims, 7 Drawing Sheets

PLASMA PROCESSING METHOD AND PLASMA PROCESSING APPARATUS

BACKGROUND OF THE INVENTION

1. Field of the Invention

The present invention relates to a plasma processing method and a plasma processing apparatus capable of being used for manufacturing a color filter or the like.

2. Related Art

As shown in FIG. 6A, a color filter is provided with a glass plate 1 as a base member and a black matrix 2 formed on the glass plate 1. The black matrix 2 includes a number of fine concave portions 3, and coloring inks 4, 5 and 6 for RGB (Red, Green and Blue) are filled into each of the corresponding concave portions 3, whereby the respective pixels for RGB are formed on the glass plate 1.

As a method of manufacturing such color filter, there has been conventionally used a pigment dispersion method or the like in which a photolithography process is repeatedly performed for several times. In recent years, however, an ink-jet apparatus has been used for manufacturing the color filter. The manufacturing method using the ink-jet apparatus comprises the steps of forming the black matrix 2 on the glass plate 1, moving a scanning head of the ink-jet apparatus so as to scan a surface of the glass plate 1, spraying micro droplets of the coloring inks 4, 5 and 6 for RGB colors, and charging (filling) the coloring inks 4, 5 and 6 into the respective concave portions 3 of the black matrix 2 to thereby form the respective pixels for RGB colors on the base material (glass plate) as shown in FIG. 6A.

However, due to differences in properties of the black matrix, the coloring inks 4, 5 and 6 and the glass plate 1, there is caused a case where, for example, the coloring inks 4, 6 do not correctly fill the concave portions 3 of the black matrix 2 as shown in FIG. 6B. If this coloring ink 4 is for R, B colors, portions lacking the R, B colors are revealed as white voids on a display using this color filter. Further, as shown in FIG. 6C, there is caused a case where the coloring inks 4, 5 are mutually mixed to each other at a portion between adjacent concave portions 3, 3 of the black matrix 2. In this case, color dots blur, and the correct colors cannot be displayed.

In order to prevent the above defects such as the white voids, the color mixing and the like, there has been proposed a countermeasure in which the glass plate 1 formed with the black matrix 2 is subjected to a plasma processing as proposed in, for example, Japanese Patent No. 3328297 (Patent Publication 1). In this countermeasure, an organic material is contained in the black matrix 2, and the plasma processing is performed to the glass plate 1 from an upper surface side of the black matrix 2 under a condition that a degree of non-affinity of the coloring inks 4, 5 and 6 with respect to the surface of the black matrix 2 becomes higher than that with respect to the surface of the glass plate 1.

As an apparatus for performing the above plasma processing, it is possible to utilize an apparatus which includes a fixed electrode and a plate-shaped movable electrode moving under the fixed electrode, as disclosed in, for example, Japanese Unexamined Patent Application Publication No. 2002-320845 (JP-A 2002-320845: Patent Publication 2).

In the apparatus mentioned above, when the glass plate is fixed onto the movable electrode, and while the movable electrode is moved under the fixed electrode, voltage is applied to both the electrodes, and a process gas is introduced to a portion between the both electrodes, a plasma generated at a space between the both electrodes can be radiated to the glass plate. Due to this plasma processing, the degree of non-affinity of the black matrix 2 with respect to the coloring inks 4, 5 and 6 is increased. As a result, when the coloring inks 4, 5 and 6 for the respective pixels are sprayed to the glass plate 1 by using an ink-jet printing method at a subsequent manufacturing step, the disadvantages or defects as indicated in FIGS. 6B and 6C can be eliminated to some extent.

However, when the movable electrode is moved, there is a case where an ambient air (outside air) a is introduced from right and left sides with respect to the moving direction of the movable electrode and the ambient air a is involved into a plasma processing space between the movable electrode and the glass plate. When such ambient air a is involved into the plasma processing space, fluorine, for example, contained in the process gas is combined to hydrogen of water vapor contained in the ambient air a, so that bondage (bonding) between the fluorine component and the black matrix is obstructed, and the black matrix becomes liable to peel off from the glass plate as a processing object. Further, the non-affinity of the black matrix with respect to the ink is lowered, or the affinity of the glass plate 1 is retarded, so that the disadvantages or defects indicated in FIGS. 6B and 6C are still caused.

In order to prevent these defects, a conventional plasma processing apparatus is configured as shown in FIG. 7 in which the plasma processing space is formed between the movable electrode 7 and the glass plate 1, and both the end portions of the plasma processing space are blocked by blocking members 14 provided to both the end portions of the movable electrode, the end portions being in relatively parallel with the moving direction of the movable electrode. As a result, the ambient air a is suppressed from invading into the plasma processing space as proposed in the Japanese Unexamined Patent Application Publication No. 2005-19150 (JP-A 2005-19150: Patent Publication 3).

According to the conventional plasma processing method, as shown in FIG. 7, the blocking member 14 is formed so as to project from a side of the movable electrode 7 toward a side of the fixed electrode 8 to thereby form a slight gap at tip end portion of the blocking member 14, and accordingly, the ambient air a enters into the plasma processing space through the gap. This entering ambient air a flows and reaches to a surface of the glass plate 1, which is positioned at level higher than that of the gap. The entering ambient air a becomes a factor to cause the plasma processing defects as mentioned hereinbefore. Therefore, the defects or disadvantages shown in FIGS. 6B and 6C still occur, thus being inconvenient.

SUMMARY OF THE INVENTION

The present invention was conceived in consideration of the circumstances encountered in the prior art mentioned above and an object of the invention is to provide a plasma processing method and a plasma processing apparatus free from the defects mentioned above and capable of being used for manufacturing a color filter or the like.

In order to achieve the above object, the present invention provides a plasma processing method, which includes the steps of:

providing a first and a second electrodes so as to be relatively movable in parallel;

disposing an object to be processed on the second electrode so as to face the first electrode;

providing a blocking member to both end portions of the second electrode in parallel in the relative moving direction of the first and second electrodes, so that a plasma processing space formed between the first electrode and the object to be processed is blocked by the blocking member when the first and second electrodes are moved relatively in parallel with each other;

applying voltage to both the first and the second electrodes and introducing a process gas into the plasma processing space formed between the first and second electrodes while both the first and second electrodes are relatively moved in parallel with each other; and radiating the plasma generated at a portion between the first and second electrodes to the object to be processed, wherein the blocking member is provided so as to extend from the second electrode to the first electrode so that an upper surface of the blocking member is raised higher than or equal to a surface level of the object disposed on the second electrode.

Further, to achieve the above object, the present invention also provides a plasma processing apparatus, which includes:

a pair of first and second electrodes disposed to be relatively movable in parallel directions;

an object to be processed disposed on the second electrode so that the object to be processed faces the first electrode;

a blocking member provided to both end portions of the second electrode, which is in parallel with the relatively parallel moving direction of the first and second electrodes, so that a plasma processing space formed between the first electrode and the processing object is blocked by the blocking member when the first and second electrodes are moved relatively in parallel with each other;

a process gas supplying means for introducing the process gas into the plasma processing space when both the first and second electrodes are moved relatively in parallel direction; and a power source for applying voltage to both the first and the second electrodes so as to generate plasma and radiating the plasma generated at a portion between the first and second electrodes to the object, wherein the blocking member is provided so as to extend from the second electrode to the first electrode so that an upper surface of the blocking member is raised higher than or equal to a surface level of the object disposed on the second electrode.

In the above invention, the processing object is constituted by, for example, a base member composed of inorganic material for a color filter. More concretely, the processing object may be formed of, for example, a transparent glass plate. A black matrix is formed on the base member by using black ink containing an organic material. Examples of shape of the base member may include film-shape, sheet-shape or the like other than plate-shape.

As the processing gas, halogen gasses containing fluorine or fluorine compounds such as $CF_4$, $C_2F_6$, $CClF_3$, $SF_6$ can be preferably used. The processing gas is formed as a mixed gas prepared by mixing fluorine or fluorine compound with oxygen or the like. By controlling the mixing ratio of the oxygen and the fluorine or fluorine compound, it is possible to increase a difference in contact angles of the coloring inks between the surfaces of the black matrix and the base member. Therefore, non-affinity of the black matrix with respect to the coloring ink can be increased. Simultaneously, affinity of the base member surface with respect to the coloring ink can be also increased.

The plasma processing can be performed under not only an airtight atmosphere but also atmospheric pressured condition.

The second electrode on which the object to be processed is disposed can be formed so as to provide a plate-shape, while the first electrode can be formed to have an extended rod-shape which traverses the plate-shaped second electrode.

The blocking member is provided so as to block (seal) the plasma processing space formed at a portion between the first electrode and the object to be processed. The blocking member blocks the plasma processing space at both end portions of the first electrode. The end portions are parallel with the relatively moving direction of the first and second electrodes. The blocking member is provided so as to extend from the second electrode toward the first electrode, and an upper surface of the blocking member is protruded higher than a surface level of the object disposed on the second electrode.

A vertical interval γ between an upper end surface of the blocking member and the surface of the processing object is preferably set as high as possible as far as the vertical interval γ would not constitute an obstacle for the plasma processing. The upper end surface of the blocking member may be formed as not only a flat surface but also a curbed surface.

A small amount of ambient air a is penetrated into the plasma processing space through a slight gap δ remaining between the upper surface of the blocking member and the first electrode side. However, due to the existence of the above vertical interval γ, the ambient air a flows in the plasma processing space along a portion close to the first electrode without disturbing the processing gas and plasma flowing along a portion close to the surface of the glass plate 1 in the plasma processing space.

Accordingly, since a component, for example, fluorine contained in the processing gas is smoothly combined with the black matrix, so that the black matrix can be prevented from peeling-off from the object to be processed. Furthermore, since the difference in contact angle of an ink between the black matrix and the surface of the object can be increased, the non-affinity of the black matrix with respect to a black ink can be improved more than that of the object surface. As a result, even if the ink for a color filter fills a concave portion formed to the black matrix, the previously mentioned various defects such as color void, color mixing or the like as shown in FIGS. 6B and 6C can be effectively prevented, so that it becomes possible to correctly charge the ink into the respective concave portions as shown in FIG. 6A.

In the above plasma processing method and apparatus, it is preferable that the blocking member for blocking the plasma processing space extends in advance along the relatively parallel moving direction. The blocking member is formed to have a length somewhat longer than that of the object to be processed in parallel and relatively moving direction.

According to the plasma processing method and apparatus of the present invention mentioned above, the ambient air a is hardly involved into the plasma processing space. Even if a small amount of the ambient air a invades into the plasma processing space, the ambient air a flows in the plasma processing space along a portion close to the first electrode without disturbing the processing gas and the plasma flowing along a portion close to the surface of the object to be processed (i.e., glass plate) in the plasma processing space.

Due to the above structure, only the processing gas b can be converted into plasma, and the black matrix and the object can be subjected to the plasma processing by using only the plasma of the processing gas b, so that it becomes possible to prevent the black matrix from peeling-off from the processing object.

Furthermore, since the difference in the contact angle of an ink between the black matrix and the surface of the object to be processed can be increased, the non-affinity of the black matrix with respect to the coloring inks can be improved more than that of the surface of the object, and the affinity of the surface of the object with respect to the coloring ink can be improved.

As a result, when the coloring inks fill the concave portions formed to the black matrix, the previously mentioned various defects such as color void, color mixing or the like as shown in FIGS. 6B and 6C can be effectively prevented, so that it becomes possible to correctly charge the coloring inks into the concave portions as shown in FIG. 6A.

Furthermore, according to the plasma processing method and apparatus of the present invention, the blocking member is provided to a side of the second electrode onto which the object to be processed is disposed. In contrast, in the conventional plasma processing method and apparatus as shown in FIG. 7, the blocking member is provided to a side of the first electrode. When comparing the present invention with the conventional one, the present invention can effectively avoid a situation where an entire blocking member is constantly applied with discharge during the time of the discharging operation performed between the first electrode and the second electrode. Therefore, since a damage of the blocking member due to the discharge can be effectively alleviated, the blocking member can exhibit an excellent blocking property and the blocking property can be maintained for a long period of time.

According to a further aspect of the present invention, there is also provided a method of manufacturing a color filter, which includes the steps of:

providing a first and a second electrodes so as to be relatively movable in parallel;

disposing an object, on which a black matrix is formed, on the second electrode so as to face the first electrode;

providing a blocking member to both end portions of the second electrode in parallel in the relative moving direction of the first and second electrodes, so that a plasma processing space formed between the first electrode and the object is blocked by the blocking member when the first and second electrodes are moved relatively in parallel with each other;

applying voltage to both the first and the second electrodes and introducing a process gas into the plasma processing space formed between the first and second electrodes while both the first and second electrodes are relatively moved in parallel with each other;

radiating the plasma generated at a portion between the first and second electrodes to the object; and filling a recessed portion of the black matrix formed on the object with a color ink.

A color filter may be preferably manufactured by this method.

The nature and further characteristic features of the present invention may be further made clearer from the following descriptions made with reference to the accompanying drawings.

BRIEF DESCRIPTION OF THE DRAWINGS

In the accompanying drawings:

FIG. 6 is a schematically enlarged cross sectional view of a color filter, in which

DESCRIPTION OF THE PREFERRED EMBODIMENTS

Preferred embodiments of the present invention will be described hereunder with reference to the accompanying drawings. Further, it is to be noted that terms "upper", "lower", "right", "left" and the like terms are used herein with reference to the illustrated state on the drawings or a general usable state of an apparatus.

First Embodiment

Figure 6A:
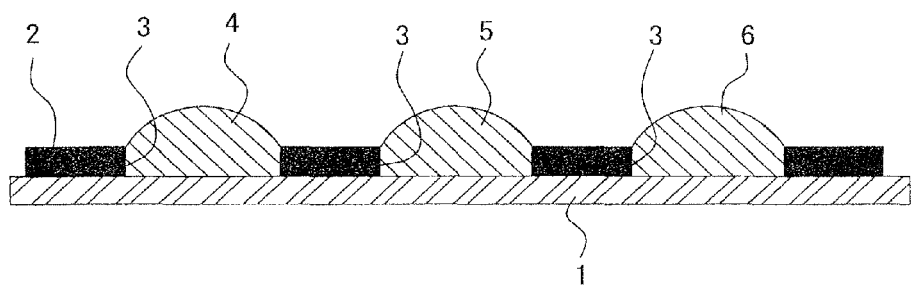
FIG. 6A is a cross sectional view showing a normal color filter.
Figure 6B:
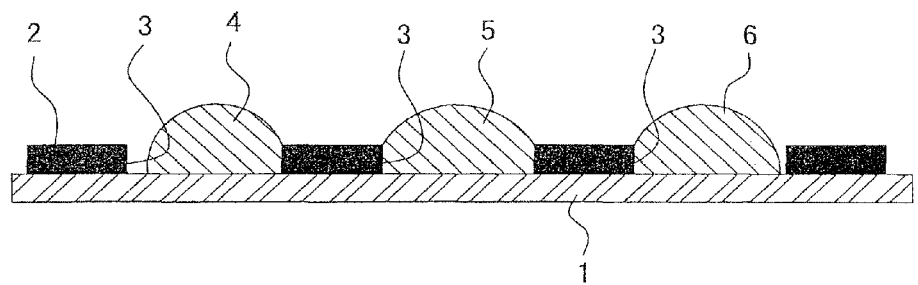
FIG. 6B is a cross sectional view showing a color filter causing a color void.
Figure 6C:
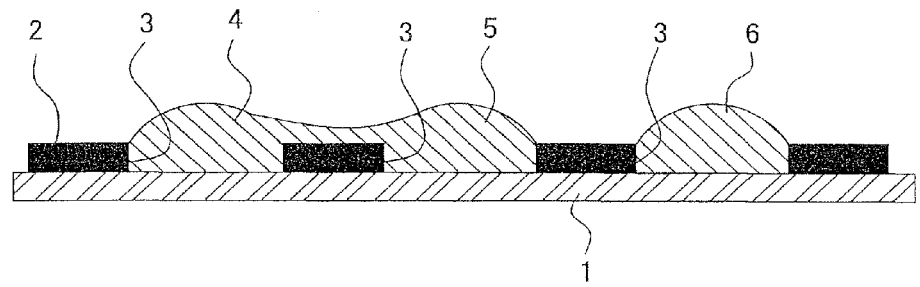
FIG. 6C is a cross sectional view showing a color filter causing a color mixing.
Figure 7:
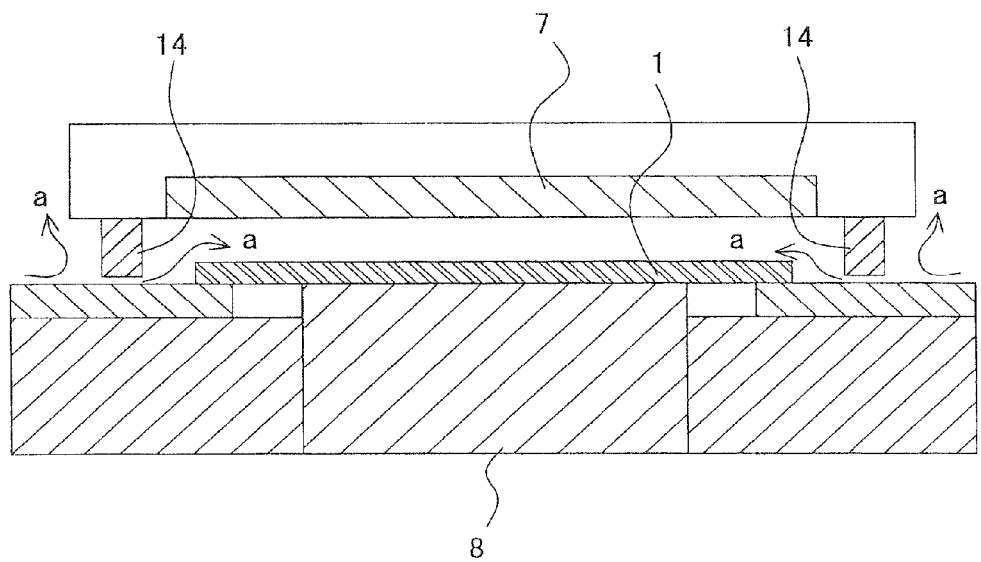
FIG. 7 is a cross sectional view showing an outline of a conventional plasma processing apparatus for embodying a conventional plasma processing method as viewed in the same manner as in FIG. 3.

In a plasma processing method according to a first embodiment of the present invention, a transparent glass plate 1 is used as an object to be processed (processed object) which constitutes a base member for a color filter. As shown in FIG. 6A, a black matrix 2 is formed in advance on a surface of the glass plate 1 by means of a printing method or the like. More specifically, the black matrix 2 is formed by printing black-type ink containing organic material such as polyimide, carbon black, titanium black or the like onto the glass plate 1.

Figure 1:
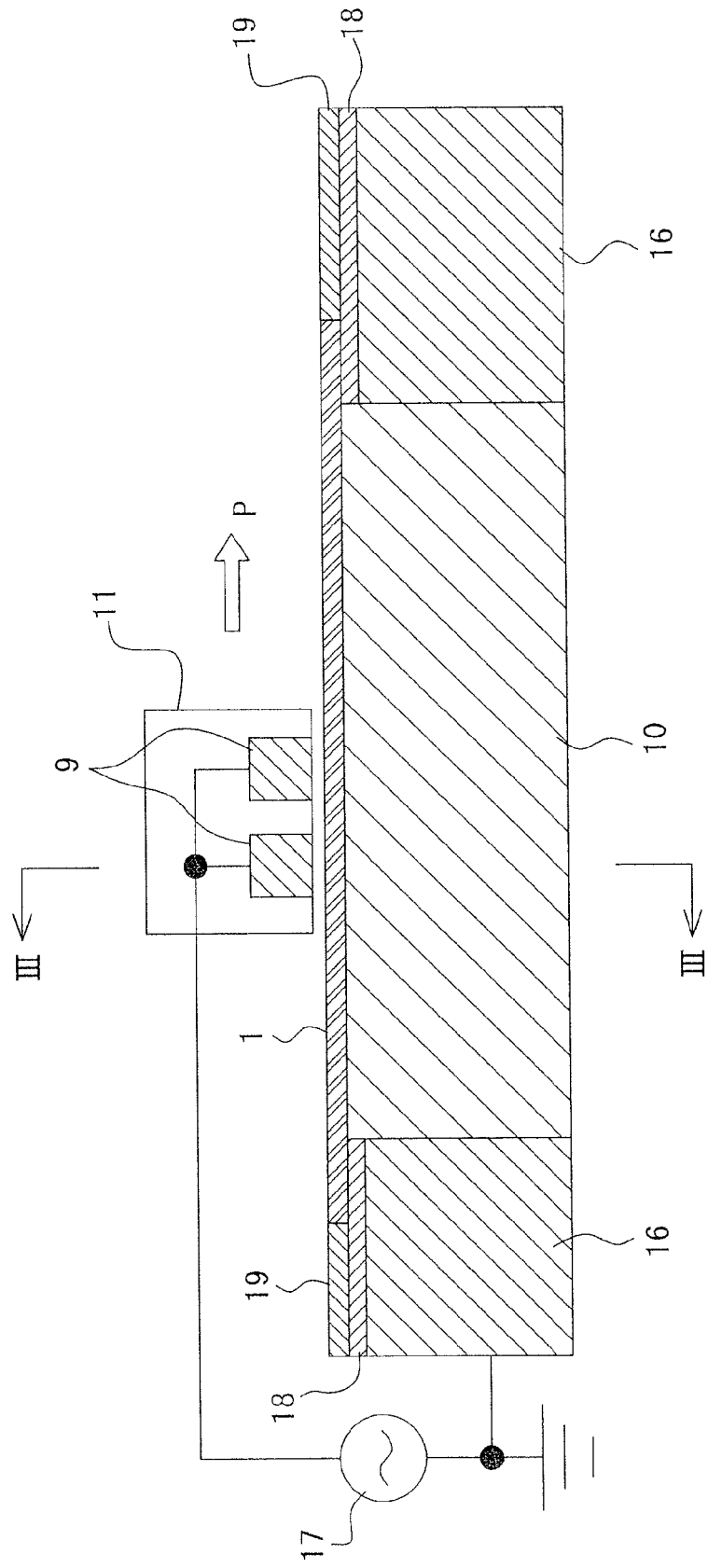
FIG. 1 is a vertical sectional view showing an outline of a plasma processing apparatus according to a first embodiment for embodying a plasma processing method of the present invention.
Figure 2:
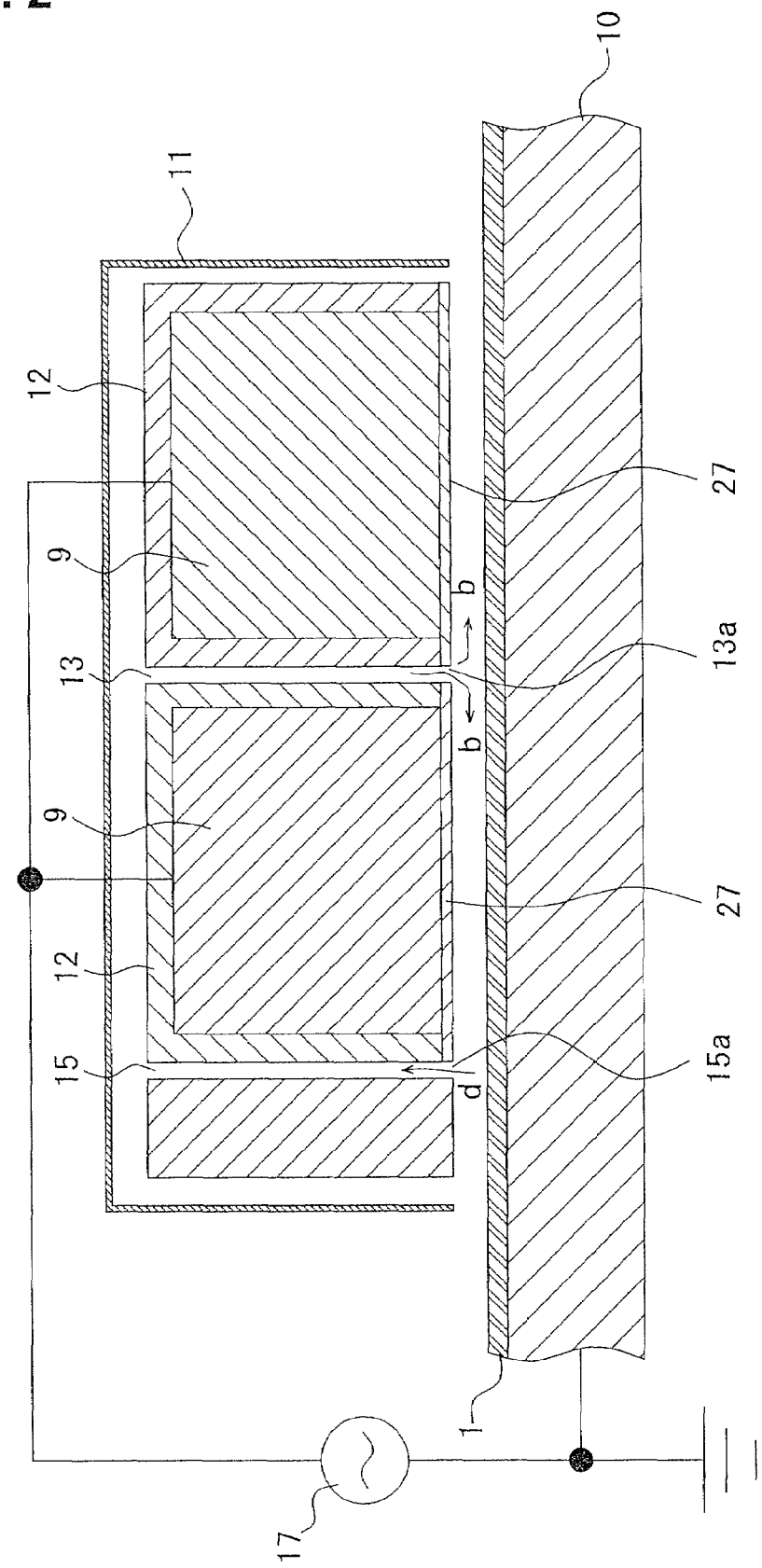
FIG. 2 is a cross sectional view showing a structure of a scanning head having a first electrode shown in FIG. 1.
Figure 3:
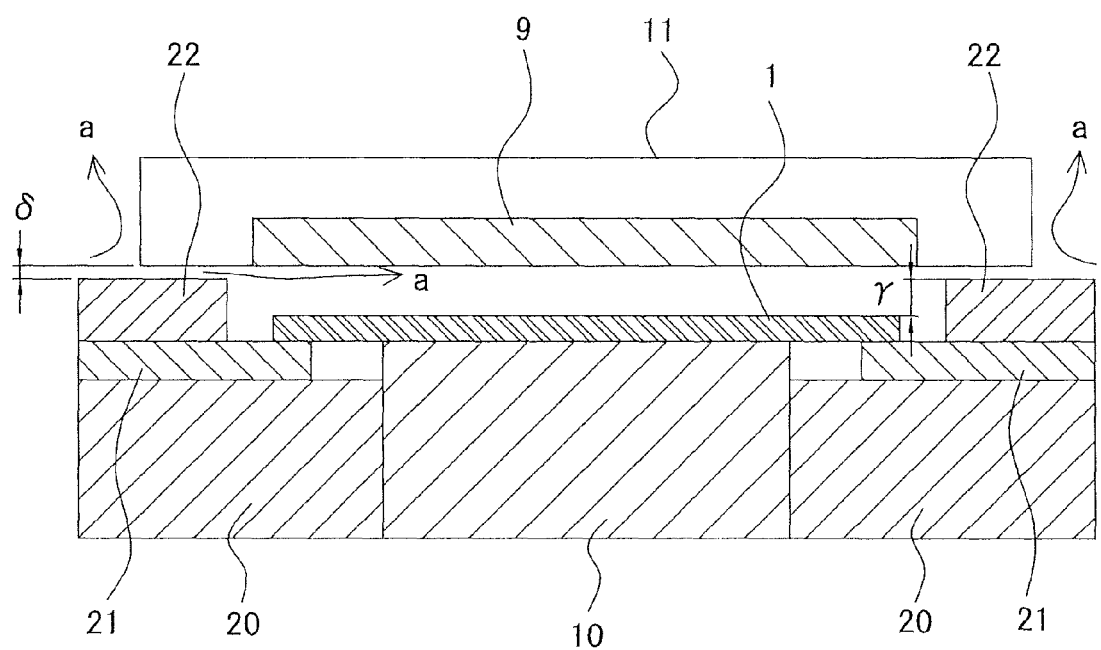
FIG. 3 is a cross sectional view taken along the line III-III in FIG. 1.

When such plasma processing method is performed, as shown in FIGS. 1 to 3, there is used a plasma processing apparatus having a pair of first and second electrodes 9 and 10 for conducting a plasma processing to the glass plate 1 formed with the black matrix 2. The apparatus uses the paired first electrode 9 and the second electrode 10 that are capable of moving relatively in parallel with each other. In FIG. 1, an arrow P denotes a parallel-moving direction.

More concretely, as shown in FIG. 2, a pair of the first electrode 9, 9 are accommodated in a scanning head 11 in parallel so as to traverse an upper region of the second electrode 10. In this first embodiment, although the scanning head 11 holds the first electrode 9 and the scanning head 11 is configured so as to be moved in parallel along the upper region of the second electrode 10, the electrodes may also be configured such that the scanning head 11 is fixed, while the second electrode 10 is constituted so as to be moved in parallel with respect to the first electrode 9. The paired first electrodes 9, 9 are covered with two cases 12, 12 formed by being divided at front and rear portions in parallel-moving direction of the scanning head 11. The paired first electrodes 9, 9 are supported at the lower side thereof by ceramics plates 27, 27, respectively. In the first embodiment, the first electrode 9 is composed of two rod-shaped electrodes. However, the first electrode 9 is not limited thereto. That is, the first electrode 9 may be also formed from one rod-shaped electrode, or at least three rod-shaped electrodes.

A flow path 13 of processing gas b is formed at a portion between the two cases 12, 12, while a slit-shaped outlet port 13a is formed at a lower end portion of the cases 12, 12. This outlet port 13a is extended in parallel with the first electrode 9. As the processing gas b, a gas containing, for example, $CF_4$ is used. The processing gas b flows downward in the flow path 13 and blows out from the outlet port 13a toward a surface of the glass plate 1 disposed on the second electrode and formed with the black matrix 2. Further, a slit-shaped suction port 15 is formed to a predetermined portion such as shown in FIG. 2. A gas d unnecessary for the plasma processing is suctioned from the suction port 15 and then discharged outward.

As shown in FIG. 1, the second electrode 10 is formed as a flat plate-shaped stage electrode. The glass plate 1 is vacuum-sucked and fixed on the second electrode 10. Although the vacuum sucking operation is not shown in figure, the operation is performed by the action of a number of hollow pins rising from and setting in an upper surface of the second electrode 10.

Electrodes 16, 16 made of aluminum are arranged on both the sides of the second electrode 10 at front and rear end portions in the moving direction of the first electrode 9, and there is disposed a power source 17 at a predetermined portion for applying a voltage to a portion between the aluminum-made electrode 16 and the first electrode 9.

When the voltage is applied to the portion between the first and second electrodes 9 and 10 while the first electrode 9 being moved in parallel above the second electrode 10 and the processing gas b is introduced into the plasma processing space, plasma is generated at the portion between the first and second electrodes 9 and 10, and then, the generated plasma is radiated to the glass plate 1 as a processing object 1.

Subsequently, fluorine formed in plasma combines with an organic material contained in the black matrix 2, so that a difference in contact angle of ink between the black matrix 2 and the glass plate 1 increases. As a result, the non-affinity of the black matrix 2 with respect to the coloring inks 4, 5, 6 can be more improved, and the affinity of the surface of the glass plate 1 with respect to the coloring ink is also improved.

As a result, when the inks 4, 5 and 6 for a color filter fills the concave portions 3 formed to the black matrix 2 at the subsequent manufacturing step, the coloring inks 4, 5 and 6 can be properly filled and spread over each of the entire concave portions 3 as shown in FIG. 6A.

As shown in FIGS. 1 and 3, the stage surface of the second electrode 10 has an area smaller than that of the glass plate 1, and front and rear end portions of the glass plate 1 are protruded from the second electrode 10 toward the front to rear direction. As shown in FIG. 1, on the aluminum-made electrodes 16, 16, are disposed lower solid dielectric bodies 18, 18 so that upper surfaces of the lower solid dielectric bodies 18, 18 flush with an upper surface of the second electrode 10. The front and rear end portions of the glass plate 1 hang on the lower solid dielectric bodies 18, 18.

Further, upper solid dielectric bodies 19, 19 are laminated on the lower solid dielectric bodies 18, 18, respectively. The laminated upper solid dielectric bodies 19, 19 are juncturally connected to the front and rear end portions of the glass plate 1 so as to have the same height as that of the glass plate 1. In this connection, the lower solid dielectric body 18 has the same relative dielectric constant and electrical resistance as those of the glass plate 1. Due to this structure, a discharge occurring at a portion between the first electrode 9 and the glass plate 1 disposed on the second electrode 10 can be appropriately taken place even at the front and rear end portions of the glass plate 1. As a result, the pixels positioned close to the front and rear end portions of the glass plate 1 can be also fairly formed.

As shown in FIG. 3, at the time when the first electrode 9 is moved in parallel with the second electrode 10 and the glass plate 1, a plasma processing space formed between the first electrode 9 and the glass plate 1 is blocked by a blocking member 22. The blocking member 22 is provided to both the end portions of the second electrode 10 in parallel with the moving direction P of the first electrode 9 relatively in parallel. Further, the blocking member 22 is provided so as to extend from the second electrode 10 to the first electrode 9, and an upper surface of the blocking member 22 is protruded higher than a surface level of the glass plate (processed object) 1 disposed on the second electrode 10.

As the result of the protruding of the upper surface of the blocking member 22, there is formed a vertical interval γ between the upper end surface of the blocking member 22 and the surface of the glass plate (processing object) 1. The vertical interval γ is set as high as possible as far as the vertical interval γ would not be an obstacle for the plasma processing. The upper end surface of the blocking member 22 is formed to be a flat surface, and this flat surface faces a lower plain surface of the scanning head 11 with a slight gap δ formed therebetween.

Both the right and left end portions of the glass plate 1 as an object to be processed also extend over the right and left end portions of the second electrode 10. However, as shown in FIG. 3, in order to support the extending portions of the glass plate 1, supports 20, 20 are disposed to the right and left portions of the second electrode 10 with spacers 21, 21 disposed between the upper surface of the support 20 and the lower surface of the glass plate 1. Each of the supports 20 is formed of an insulating material such as resin or the like, while the spacer 21 is formed of resin or other materials. The spacer 21 may be integrally formed with the support 20. The blocking member 22, which may be formed of such insulating material as mentioned above, is fixed onto the spacer 21.

The blocking member 22 may be formed to have the same length as that of the second electrode 10, or may be provided so as to extend to an entire range of the glass plate 1, or may be formed together with the support 20 and the spacer 21 so as to extend to the end portions of the aluminum-made electrodes 16, 16.

Since the blocking member 22 is a plate having a rectangular shape in section and the upper surface of the blocking member 22 is formed to flatly extend, a narrow gap formed between the lower flat surface of the scanning head 11 holding the first electrode 9 and the upper flat surface of the blocking member 22 extends to a long range. As a result, the blocking of the ambient air a can be appropriately performed.

However, the shape of the blocking member 22 is not limited to the aforementioned shape, and the blocking member 22 may adopt any other shape as far as the gap δ formed between the blocking member 22 and the first electrode 9 is effective for preventing the ambient air a from penetrating into the plasma processing space.

Furthermore, although the blocking member 22, the spacer 21 and the support 20 are separately formed as shown in FIGS. 1 to 3, these members may be also integrally formed.

As described above, when the first electrode 9 is moved, since the blocking member 22 is interposed between the first electrode 9 and the second electrode 10, the ambient air a is effectively prevented from invading into the plasma processing space formed between the first electrode 9 and the glass plate 1 as the processing object. As a result, the processing gas b is properly converted into plasma, and it becomes possible to process the black matrix 2 and the glass plate 1 by utilizing the plasma only of the processing gas b.

Further, as shown in FIG. 3, most of the ambient air a is blocked by the blocking member 22. However, there may cause a case where a small amount of the ambient air a invades into the plasma processing space through the gap δ. Due to existence of the vertical interval γ mentioned hereinbefore, the ambient air a invading into the plasma processing space flows in the plasma processing space along a portion close to the first electrode 9 without disturbing the processing gas and plasma flowing along a portion close to the surface of the glass plate 1 in the plasma processing space.

Accordingly, when fluorine, for example, contained in the processing gas b is smoothly combined with the black matrix 2, it becomes possible to prevent the black matrix 2 from peeling-off from the glass plate (processing object) 1. Further, the difference in the contact angle of an ink between the black matrix 2 and the surface of the glass plate 1 can be increased, so that the non-affinity of the black matrix 2 with respect to coloring inks 4, 5 and 6 can be further improved, and the affinity of the surface of the glass plate 1 with respect to the coloring inks 4, 5 and 6 is improved. As a result, the coloring inks 4, 5 and 6 for a color filter can be suitably charged in the concave portions 3 formed to the black matrix 2.

In this regard, according to knowledge obtained from a series of experiments conducted by the inventors of the present invention, the following technical findings were obtained. Namely, when the voltage to be applied from a power source 17 to a portion between the first electrode 9 and the second electrode 10 is set to 100V-300V (1 KHz-50 KHz), a gap of the plasma processing space is set to 0.1 mm-10 mm, preferably set to 0.1 mm-1 mm, the gap δ is set to 0.01 mm-1 mm, and the vertical interval γ formed between the glass plate 1 and the blocking member 22 is set to 0 mm-10 mm, preferably set to 0.1 mm-1 mm, the plasma processing can be performed to the surface of the glass plate 1 and the black matrix 2 without causing any trouble. As a result, it becomes possible to correctly fill the concave portions 3 of the black matrix 2 with the coloring inks 4, 5 and 6.

Next, a concrete procedure for embodying the above plasma processing method will be explained.

As shown in FIG. 1, the glass plate 1 as the processing object is disposed onto the second electrode 10 and then fixed thereto. The disposing operation of the glass plate 1 can be performed by utilizing a robot, for example.

After the completion of the disposing the glass plate 1, the first electrode 9 is moved parallelly above the second electrode 10 in the moving direction P. Specifically, the scanning head 11 shown in FIG. 2 is moved. During the moving of the first electrode 9, a voltage is applied to the portion between the first electrode 9 and the second electrode 10. Simultaneously, the processing gas b is introduced into the plasma processing space. The plasma generated at the portion between the first electrode 9 and the second electrode 10 is radiated from an upper side of the black matrix 2 to the surface of the glass plate 1.

When the first electrode 9 is moved, as shown in FIG. 3, the gaps formed between the right and left end portions in parallel with the moving direction P of the first electrode 9 and the right and left end portions of the glass plate 1 are blocked by the blocking members 22, and only slight gaps 6 are formed.

Due to this structure, the ambient air a is effectively prevented from entering into the plasma processing space formed between the first electrode 9 and the glass plate 1 when the first electrode 9 is moved. As a result, only the processing gas b (refer to FIG. 2) is properly converted into plasma, and it becomes possible to process the surface of the glass plate 1 and the black matrix 2 by utilizing the plasma only of the processing gas b.

Further, as also shown in FIG. 3, most of the ambient air a is blocked by the blocking member 22. However, there may cause a case where a small amount of the ambient air a invades into the plasma processing space through the gap δ. However, due to the existence of the vertical interval γ, ambient air a invading into the plasma processing space flows along the portion close to the first electrode 9 without disturbing the processing gas and plasma flowing along the portion close to the surface of the glass plate 1 in the plasma processing space.

Due to such structure as mentioned above, the peeling-off of the black matrix 2 from the glass plate 1 can be accurately prevented. Further, the non-affinity of the black matrix 2 with respect to the coloring inks 4, 5 and 6 can be improved more than that of the surface of the glass plate 1, and an affinity of the surface of the glass plate 1 with respect to the coloring ink can be also improved. As a result, the black matrix 2 becomes to exhibit an ink-shedding property for easily shedding the coloring inks, so that the coloring inks 4, 5 and 6 become easy to adhere to the surface of the glass plate 1 within the concave portions 3.

In a subsequent step, the glass plate 1 is subjected to a printing operation using an ink-jet system. In the printing operation, the coloring inks 4, 5 and 6 for a color filter are sprayed into the concave portions 3 of the black matrix 2. Since the glass plate 1 is subjected to the plasma processing, the coloring inks 4, 5 and 6 for the color filter are adequately and correctly supplied to the surface of the glass plate 1 within the concave portions 3 of the black matrix 2 as shown in FIG. 6A.

Further, the method of supplying the coloring inks is not limited to the ink-jet method, and it is also possible to adopt other method such as offset printing method or the like.

Second Embodiment

Figure 4:
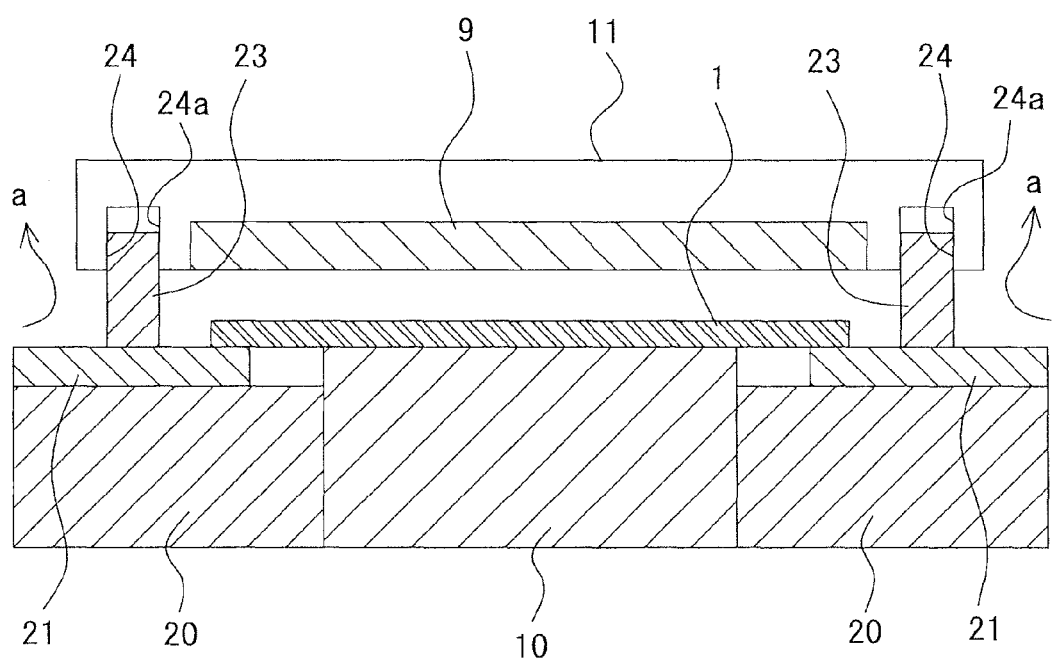
FIG. 4 is a cross sectional view showing an elemental structure of a second embodiment according to the present invention as viewed in the same manner as in FIG. 3.

Next, a second embodiment of the plasma processing method will be explained. In this second embodiment of the plasma processing method, as shown in FIG. 4, the blocking member is configured as a guide rail 23 of which top portion is fitted into a concave groove 24 formed at the portion close to the first electrode 9.

More specifically, the guide rail 23 is fixed to the support 20 in parallel with the parallel-moving direction P of the scanning head 11. Then, the guide rail 23 is slidably fitted into the concave groove 24 formed to the scanning head 11 holding the first electrode 9.

Since the first electrode 9 is moved above the second electrode 10 in a state that both the right and left sides of the plasma processing space are completely blocked, the involving of the ambient air a into the space between the first electrode 9 and the glass plate 1 can be prevented more securely. Further, due to the mutual sliding-contact of an inner surface of the concave groove 24 and the surface of the guide rail 23, micro dust or the like are unavoidably generated. However, the dust or the like are sealed within a cavity 24a of the concave groove 24, so that the dust or the like can be effectively prevented from falling down on the glass plate 1 or the like.

Third Embodiment

Figure 5:
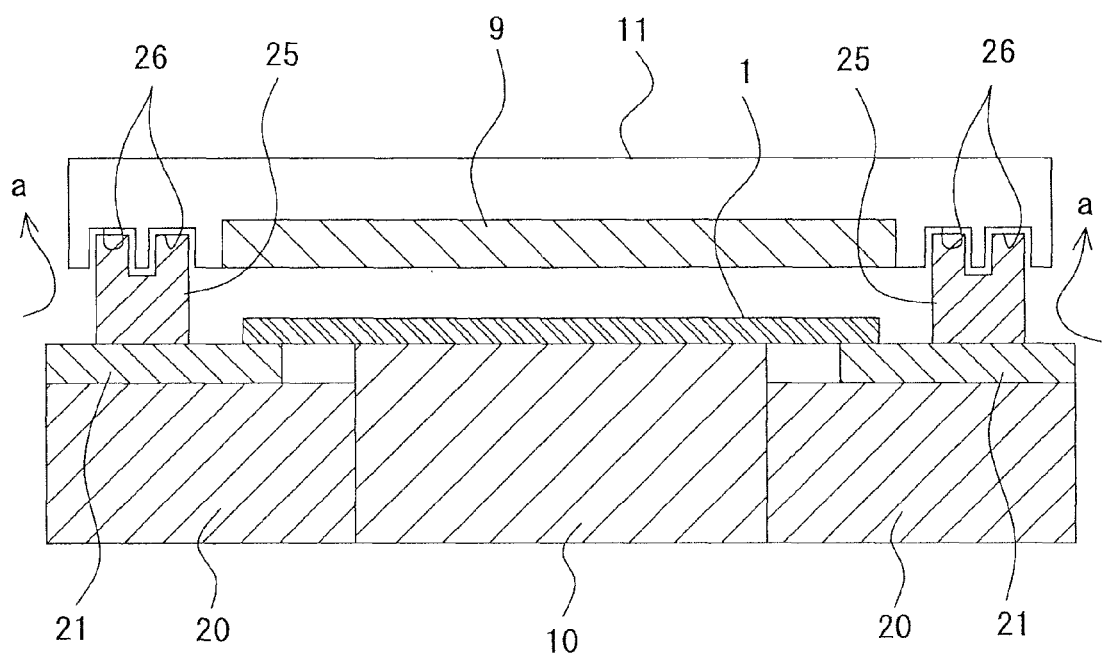
FIG. 5 is cross sectional view showing an elemental structure of a third embodiment according to the present invention as viewed in the same manner as in FIG. 3.

As shown in FIG. 5, in the plasma processing method of a third embodiment, the blocking member is configured as a labyrinth rail 25 of which top portion is fitted into a plurality rows of concave grooves 26 formed at the portion close to the first electrode 9.

More specifically, the labyrinth rail 25 is fixed to the support 20. Then, a plurality of convex rows of the labyrinth rail 25 are fitted into a plurality rows of the concave grooves 26 formed to the scanning head 11 holding the first electrode 9 so that a labyrinth-shaped gap is formed between the labyrinth rail 25 and the concave grooves 26.

Due to this configuration, the first electrode 9 is moved above the second electrode 10 in a state that both the right and left sides of the plasma processing space are completely blocked, and accordingly, the involving of the ambient air a into the space between the first electrode 9 and the glass plate 1 can be effectively intercepted.

As described above in this third embodiment, since the labyrinth-shaped gap is formed between the labyrinth rail 25 and the concave grooves 26, blocking property against the ambient air a can be improved. In particular, since both the labyrinth rail 25 and the concave grooves 26 do not directly contact to each other, it becomes possible to prevent the dust and so on from generating unlike in the second embodiment in which the guide rail 23 directly contacts to the concave groove 24a.

Further, even in a case where a small amount of ambient air a invades into the plasma processing space through the labyrinth-shaped gap, the invading air does not disturb the plasma processing because of the same reason as explained in the first embodiment.

Although the plasma processing method of the present invention has been explained with reference to the above embodiments by exemplifying the cases where the present invention is applied to the method of manufacturing the color filter, the present invention is not particularly limited thereto. For example, the present invention is also applicable to a method of manufacturing a color organic EL (electroluminescence) or the like.

Further, although in the embodiments mentioned above, the first electrode is configured to be movable in parallel with the second electrode, it is also possible to adopt a structure in which the first electrode is fixed while the second electrode is configured to be movable in parallel with respect to the first electrode.

The entire disclosure of Japanese Patent Application No. 2006-055976 filed on Mar. 2, 2006 including the specification, claims, drawings and summary are incorporated herein by reference in its entirety.

What is claimed is:

1. A plasma processing method comprising the steps of:
   providing a first and a second electrodes so as to be relatively movable in parallel;
   disposing an object to be processed on the second electrode so as to face the first electrode;
   providing a blocking member to both end portions of the second electrode in parallel in a relative moving direction of the first and second electrodes, so that a plasma processing space formed between the first electrode and the object to be processed is blocked by the blocking member when the first and second electrodes are moved relatively in parallel with each other;
   applying voltage to both the first and the second electrodes and introducing a process gas into the plasma processing space formed between the first and second electrodes while both the first and second electrodes are relatively moved in parallel with each other; and
   radiating the plasma generated at a portion between the first and second electrodes to the object to be processed,
   wherein the blocking member is provided so as to extend from the second electrode to the first electrode so that an upper surface of the blocking member is raised higher than a surface level of the object disposed on the second electrode and further wherein the blocking member is configured as a guide rail having a top portion fitted to a concave groove formed at a portion close to the first electrode.

2. The plasma-processing method according to claim 1, wherein the blocking member is preliminarily extended along the relatively parallel moving direction.

3. The plasma processing method according to claim 1, wherein the blocking member is configured as a labyrinth rail having a top portion fitted to a plurality rows of concave grooves formed at a portion close to the first electrode.

4. A method of manufacturing a color filter comprising the steps of providing a first and a second electrodes so as to be relatively movable in parallel;
   disposing an object, on which a black matrix is formed, on the second electrode so as to face the first electrode;
   providing a blocking member to both end portions of the second electrode in parallel in a relative moving direction of the first and second electrodes, so that a plasma processing space formed between the first electrode and the object is blocked by the blocking member when the first and second electrodes are moved relatively in parallel with each other;
   applying voltage to both the first and the second electrodes and introducing a process gas into the plasma processing space formed between the first and second electrodes while both the first and second electrodes are relatively moved in parallel with each other;
   radiating the plasma generated at a portion between the first and second electrodes to the object; and
   filling a recessed portion of the black matrix formed on the glass plate with a color ink,
   wherein the blocking member is provided so as to extend from the second electrode to the first electrode so that an upper surface of the blocking member is raised higher than a surface level of the object disposed on the second electrode, and further wherein the blocking member is configured as a guide rail having a top portion fitted to a concave groove formed at a portion close to the first electrode.

* * * * *